(12) United States Patent
Zhao et al.

(10) Patent No.: US 10,446,552 B2
(45) Date of Patent: Oct. 15, 2019

(54) MEMORY ELEMENT

(71) Applicant: Toshiba Memory Corporation, Minato-ku (JP)

(72) Inventors: Dandan Zhao, Kawasaki (JP); Reika Ichihara, Yokohama (JP); Haruka Sakuma, Yokkaichi (JP); Yuuichiro Mitani, Miura (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/912,664

(22) Filed: Mar. 6, 2018

(65) Prior Publication Data
US 2019/0088655 A1  Mar. 21, 2019

(30) Foreign Application Priority Data
Sep. 19, 2017  (JP) .................... 2017-179542

(51) Int. Cl.
*H01L 27/10* (2006.01)
*G11C 13/00* (2006.01)
*H01L 27/105* (2006.01)
*H01L 45/00* (2006.01)

(52) U.S. Cl.
CPC ...... *H01L 27/1052* (2013.01); *G11C 13/0002* (2013.01); *H01L 45/085* (2013.01); *H01L 45/12* (2013.01); *H01L 45/1233* (2013.01); *H01L 45/1266* (2013.01); *H01L 45/141* (2013.01); *H01L 45/148* (2013.01)

(58) Field of Classification Search
CPC ... H01L 27/1052; H01L 45/085; H01L 45/12; G11C 13/0002
See application file for complete search history.

(56) References Cited

U.S. PATENT DOCUMENTS

| 7,868,537 | B2* | 1/2011 | Meijer | .................... | B82Y 30/00 |
| | | | | | 313/504 |
| 8,274,817 | B2* | 9/2012 | Schloss | .............. | G11C 13/0007 |
| | | | | | 365/148 |
| 8,493,138 | B2* | 7/2013 | Strachan | .................. | H01G 7/06 |
| | | | | | 257/532 |

(Continued)

FOREIGN PATENT DOCUMENTS

| JP | 2010-056533 | 3/2010 |
| JP | 2011-049239 | 3/2011 |

(Continued)

*Primary Examiner* — Ida M Soward
(74) *Attorney, Agent, or Firm* — Oblon, McClelland, Maier & Neustadt, L.L.P.

(57) ABSTRACT

According to one embodiment, a memory element includes a first conductive layer, a second conductive layer, and a first layer. The first conductive layer includes an ion source. The first layer includes a first element and is provided between the first conductive layer and the second conductive layer. An electronegativity of the first element is greater than 2. The first layer includes a first region and a second region. The first region includes the first element. The second region is provided between the first region and the second conductive layer. The second region does not include the first element, or the second region includes the first element, and a concentration of the first element in the first region is higher than a concentration of the first element in the second region.

19 Claims, 9 Drawing Sheets

(56) References Cited

U.S. PATENT DOCUMENTS

| | | | |
|---|---|---|---|
| 8,565,003 B2* | 10/2013 | Siau | G11C 11/5685 365/148 |
| 8,605,483 B2* | 12/2013 | Williams | G11C 13/02 365/148 |
| 8,796,103 B2* | 8/2014 | Tendulkar | H01L 45/08 257/4 |
| 9,058,876 B2* | 6/2015 | Cleveland | G11C 13/0097 |
| 9,159,769 B2* | 10/2015 | Suguro | H01L 45/085 |
| 9,159,913 B2* | 10/2015 | Rinerson | G06F 17/5045 |
| 9,831,427 B1* | 11/2017 | Haase | H01L 45/12 |
| 10,262,836 B2* | 4/2019 | Chang | H01J 37/32348 |
| 2010/0019312 A1 | 1/2010 | Sekine et al. | |
| 2011/0049612 A1 | 3/2011 | Higuchi et al. | |
| 2013/0306932 A1 | 11/2013 | Fujii et al. | |
| 2014/0027699 A1 | 1/2014 | Aoki et al. | |
| 2014/0070160 A1 | 3/2014 | Ishikawa et al. | |
| 2015/0083987 A1* | 3/2015 | Kakushima | H01L 45/08 257/4 |
| 2017/0019034 A1* | 1/2017 | Fujita | F03G 7/08 |
| 2018/0179089 A1* | 6/2018 | Connor, Jr. | C02F 1/4604 |
| 2019/0080854 A9* | 3/2019 | Brambilla | H01G 11/68 |

FOREIGN PATENT DOCUMENTS

| | | |
|---|---|---|
| JP | 2012-253192 | 12/2012 |
| JP | 2014-027185 | 2/2014 |

* cited by examiner

MEMORY ELEMENT

CROSS-REFERENCE TO RELATED APPLICATIONS

This application is based upon and claims the benefit of priority from Japanese Patent Application No. 2017-179542, filed on Sep. 19, 2017; the entire contents of which are incorporated herein by reference.

FIELD

Embodiments described herein relate generally to a memory element.

BACKGROUND

For example, there is a resistance random access memory element used in a cross-point memory device, etc. It is desirable to improve the retention characteristics of data in such a memory element.

DETAILED DESCRIPTION

Figure 1:
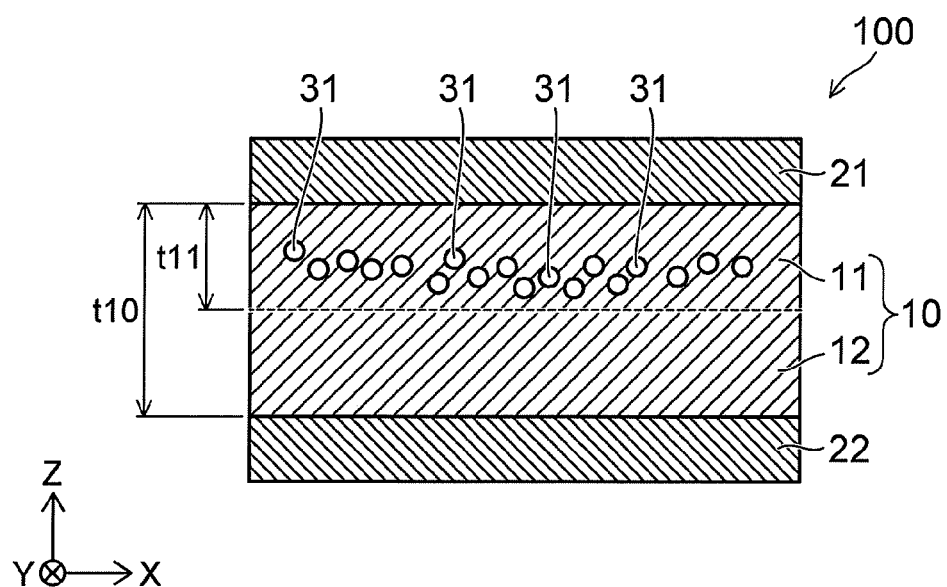
FIG. 1 is a schematic cross-sectional view illustrating a memory element according to an embodiment.

According to one embodiment, a memory element includes a first conductive layer, a second conductive layer, and a first layer. The first conductive layer includes an ion source. The first layer includes a first element and is provided between the first conductive layer and the second conductive layer. An electronegativity of the first element is greater than 2. The first layer includes a first region and a second region. The first region includes the first element. The second region is provided between the first region and the second conductive layer. The second region does not include the first element, or the second region includes the first element, and a concentration of the first element in the first region is higher than a concentration of the first element in the second region.

According to one embodiment, a memory element includes a first conductive layer, a second conductive layer, and a first layer. The first conductive layer includes an ion source. The first layer includes a second element and is provided between the first conductive layer and the second conductive layer. An electronegativity of the second element is 2 or less. The first layer includes a first region and a second region. The second region is provided between the first region and the second conductive layer. The first region does not include the second element, or the first region includes the second element, and a peak concentration of the second element in the first layer is higher than a concentration of the second element in the first region.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing hereinabove are marked with like reference numerals, and a detailed description is omitted as appropriate.

FIG. 1 is a schematic cross-sectional view illustrating a memory element according to an embodiment.

As shown in FIG. 1, the memory element 100 according to the embodiment includes a first conductive layer 21, a second conductive layer 22, and a first layer 10.

The first conductive layer 21 includes a first metallic element. The first metallic element includes, for example, at least one selected from the group consisting of silver (Ag), copper (Cu), cobalt (Co), nickel (Ni), aluminum (Al), titanium (Ti), tantalum (Ta), and gold (Au). The first metallic element includes, for example, a metal that is ionized easily. The first metallic element is, for example, an ion source.

The second conductive layer 22 includes, for example, at least one selected from the group consisting of silicon (Si), germanium (Ge), silicon germanium (SiGe), platinum (Pt), titanium nitride (TiN), tungsten (W), molybdenum (Mo), and tantalum (Ta). The second conductive layer 22 may be, for example, a polycrystalline semiconductor (Si, Ge, SiGe, etc.) doped with an impurity.

The direction from the second conductive layer 22 toward the first conductive layer 21 is taken as a Z-axis direction (a first direction). One direction perpendicular to the Z-axis direction is taken as an X-axis direction. A direction perpendicular to the X-axis direction and perpendicular to the Z-axis direction is taken as a Y-axis direction.

The first layer 10 is provided between the first conductive layer 21 and the second conductive layer 22. For example, the first layer 10 contacts the first conductive layer 21 and the second conductive layer 22. The first layer 10 includes, for example, at least one selected from the group consisting of silicon, germanium, silicon germanium, silicon oxide, germanium oxide, and silicon germanium oxide. A thickness t10 (the length along the Z-axis direction) of the first layer 10 is, for example, not less than about 1 nanometer (nm) and not more than about 100 nm.

The electrical resistance of the first layer 10 is changed by a voltage applied between the first conductive layer 21 and the second conductive layer 22. The first layer 10 is, for example, a variable resistance layer. The electrical resistance between the first conductive layer 21 and the second conductive layer 22 is changed by the voltage applied between the first conductive layer 21 and the second conductive layer 22.

The first layer 10 includes a first element 31. The first element 31 is an element having an electronegativity of greater than 2. For example, the first layer 10 is a layer (silicon oxide, etc.), which is doped with an impurity (the first element 31). The first element 31 is, for example, a negatively-charged element having a negative charge (e.g., an element that can become an ion charged with a negative charge). The first element includes, for example, at least one selected from the group consisting of fluorine (F), chlorine (Cl), bromine (Br), iodine (I), oxygen (O), sulfur (S), selenium (Se), and tellurium (Te).

The first layer 10 includes a first region 11 and a second region 12. The first region 11 includes the first element. The second region 12 is provided between the first region 11 and the second conductive layer 22. For example, the first region 11 contacts the first conductive layer 21. For example, the second region 12 contacts the second conductive layer 22. In the example shown in FIG. 1, the second region 12 is continuous with the first region 11. Another region may be provided between the first region 11 and the second region 12.

A thickness t11 (the length along the Z-axis direction) of the first region 11 is not more than 0.5 times the thickness t10 of the first layer 10, and favorably not less than 0.2 times and not more than 0.4 times the thickness t10. The thickness t11 of the first region 11 is, for example, greater than 0 nm and not more than 50 nm.

Figure 2:
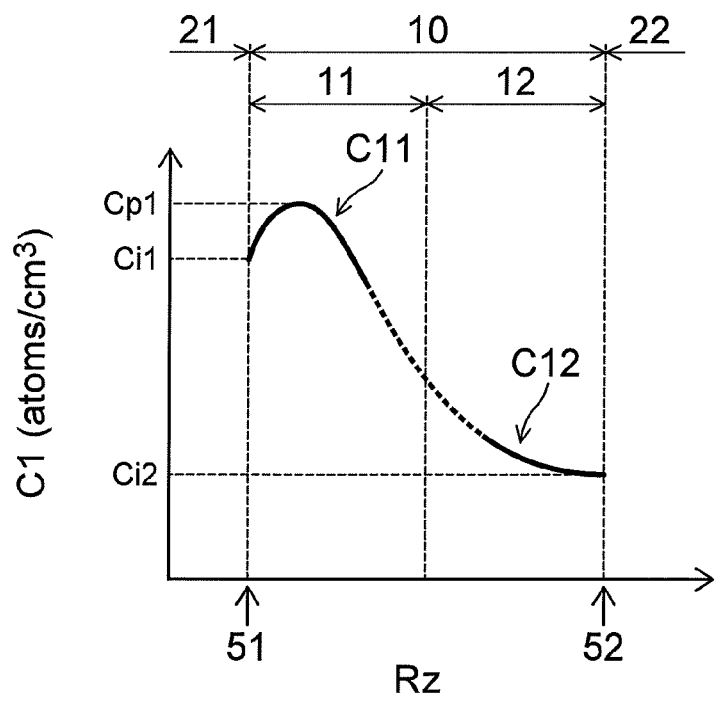
FIG. 2 is a schematic view illustrating the concentration of the first element in the first layer of the memory element according to the embodiment.

FIG. 2 is a schematic view illustrating the concentration of the first element in the first layer of the memory element according to the embodiment.

The vertical axis of FIG. 2 is a concentration C1 (atoms/cm$^3$ (atoms/cubic centimeter)) of the first element 31 in the first layer 10. The horizontal axis of FIG. 2 is a position Rz in the Z-axis direction. In the embodiment, the concentration can be measured by, for example, secondary ion mass spectrometry (SIMS).

In the example shown in FIG. 2, the second region 12 includes the first element 31. As shown in FIG. 2, a concentration C11 of the first element 31 in the first region 11 is higher than a concentration C12 of the first element 31 in the second region 12. Thereby, the retention characteristics of the data can be improved. The second region 12 may not include the first element 31.

For example, the concentration C11 of the first element 31 in the first region 11 is not less than $1 \times 10^{16}$ atoms/cm$^3$ and not more than $1 \times 10^{21}$ atoms/cm$^3$. Favorably, the concentration C11 is $1 \times 10^{18}$ atoms/cm$^3$ or more.

For example, the concentration C12 of the first element 31 in the second region 12 is less than $1 \times 10^{16}$ atoms/cm$^3$. Favorably, the concentration C12 is less than $1 \times 10^{15}$ atoms/cm$^3$.

For example, the concentration C1 of the first element 31 has a peak (a maximum value) in the first region 11. A peak concentration Cp1 (the maximum value) of the first element 31 in the first region 11 is not less than 10 times, and favorably not less than 50 times, the maximum value of the concentration C12 of the first element 31 in the second region 12.

For example, a concentration Ci1 of the first element 31 at an interface 51 between the first region 11 and the first conductive layer 21 is lower than the peak concentration Cp1 of the first element 31 in the first region 11. The concentration Ci1 is, for example, not more than 1/10 times the concentration Cp1.

For example, a concentration Ci2 of a second element 32 at an interface 52 between the second region 12 and the second conductive layer 22 is less than $1 \times 10^{16}$ atoms/cm$^3$, and favorably less than $1 \times 10^{15}$ atoms/cm$^3$.

The concentration shown in FIG. 2 is an example; and the concentration C1 of the first element 31 of the embodiment is not limited to that recited above. For example, the concentration of the first element 31 may decrease monotonously along the direction from the first conductive layer 21 toward the second conductive layer 22. At least a portion of the concentration C11 of the first element 31 in the first region 11 may be constant along the Z-axis direction. At least a portion of the concentration C12 of the first element 31 in the second region may be constant along the Z-axis direction.

Figure 3A:
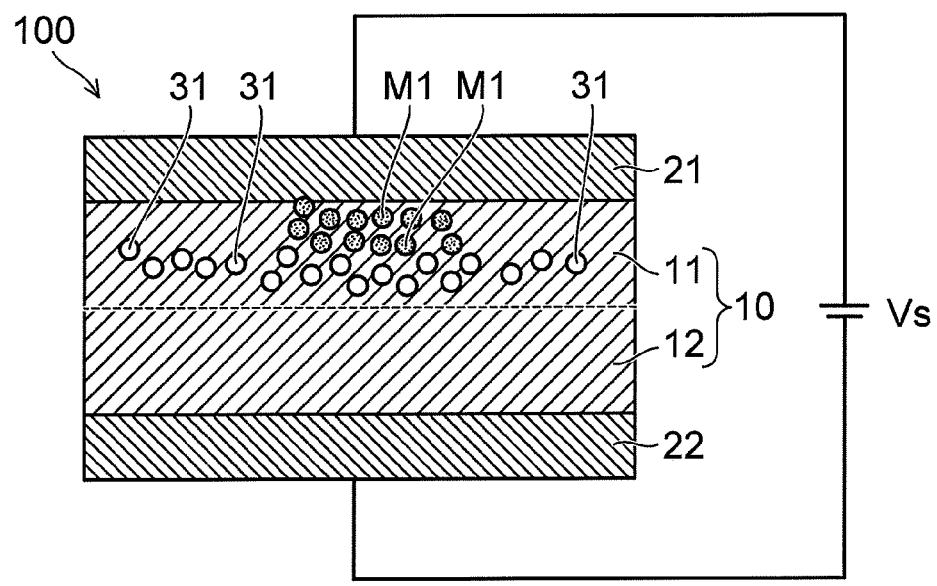
FIG. 3A and FIG. 3B are schematic cross-sectional views illustrating operations of the memory element according to the embodiment.
Figure 3B:
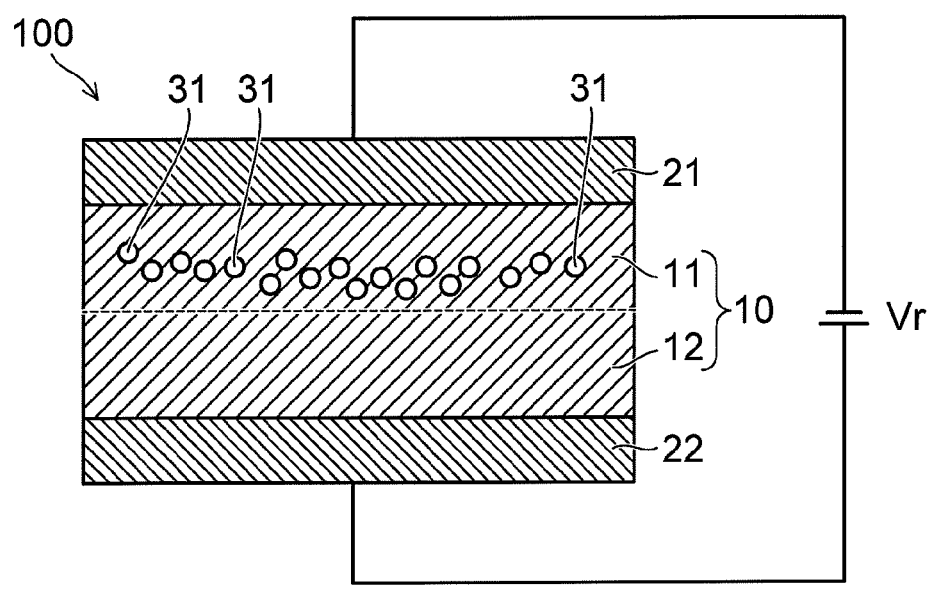

FIG. 3A and FIG. 3B are schematic cross-sectional views illustrating operations of the memory element according to the embodiment.

FIG. 3A illustrates a low resistance state of the memory element 100. As shown in FIG. 3A, a voltage (a set voltage Vs) that is positive with respect to the second conductive layer 22 is applied to the first conductive layer 21. Then, positive ions are produced by an oxidation reaction of a first metallic element M1 (e.g., Ag) included in the first conductive layer 21. The ionized first metallic element M1 moves into the first layer 10. For example, a filament is formed inside the first layer 10. Thus, the first layer 10 transitions from a high resistance state to a low resistance state due to the set voltage Vs. The low resistance state of the first layer 10 is maintained even after removing the set voltage Vs. The memory element 100 is, for example, a nonvolatile memory element.

FIG. 3B illustrates the high resistance state of the memory element 100. As shown in FIG. 3B, a voltage (a reset voltage Vr) that is negative with respect to the second conductive layer 22 is applied to the first conductive layer 21. Then, the first metallic element M1 that was ionized and moved into the first layer 10 returns to the first conductive layer 21 side. For example, the filament that is inside the first layer 10 is dissolved. Thus, the first layer 10 transitions from the low resistance state to the high resistance state due to the reset voltage Vr. The high resistance state of the first layer 10 is maintained even after removing the reset voltage Vr.

There are cases where it is difficult to maintain a low resistance state such as that described above for a long period of time in the memory element. For example, the distribution of the metal ions inside the variable resistance layer in the low resistance state is incidental. In such a case, the low resistance state may become unstable; and the retention characteristics of the data degrade. Conversely, in the embodiment, the first region 11 includes the first element 31. The electronegativity of the first element 31 is greater than 2; and the first element 31 is a negatively-charged element that has a negative charge. It is considered that the ionized first metallic element M1 easily concentrates in the first region 11 including the negatively-charged element. Thereby, for example, it is considered that a short and wide filament is formed; and a stable low resistance state is obtained. According to the embodiment, the retention characteristics of the data can be improved.

In the low resistance state, the concentration (atoms/cm$^3$) of the first metallic element M1 in the first region 11 is higher than the concentration (atoms/cm$^3$) of the first metallic element M1 in the second region 12. Or, in the low resistance state, the second region 12 may not include the first metallic element M1.

Figure 4:
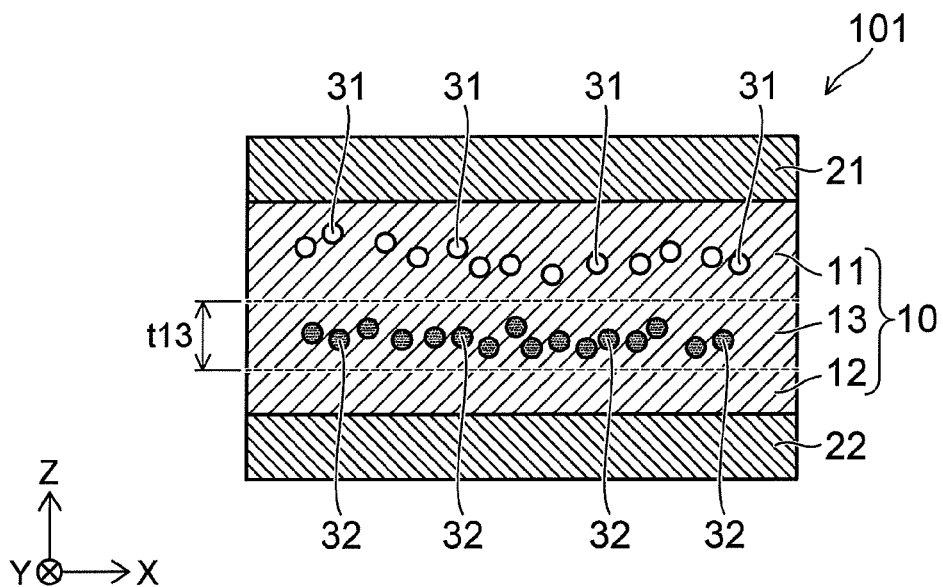
FIG. 4 is a schematic cross-sectional view illustrating another memory element according to the embodiment.

FIG. 4 is a schematic cross-sectional view illustrating another memory element according to the embodiment.

In the memory element 101 according to the embodiment as shown in FIG. 4, the first layer 10 includes the second element 32. The second element 32 is an element having an electronegativity that is 2 or less and is, for example, a positively-charged element having a positive charge (e.g., an element that becomes an ion charged with a positive charge). The second element 32 includes, for example, at least one selected from the group consisting of aluminum (Al), lanthanum (La), hafnium (Hf), and yttrium (Y).

In the example, the first layer 10 includes a third region 13 provided between the first region 11 and the second region 12. The third region 13 includes the second element 32. Or, the third region 13 is an oxide film of the second element 32. For example, the third region 13 is continuous with the first region 11 and continuous with the second region 12. Or, the third region 13 contacts the first region 11 and the second region 12. A thickness t13 (the length along the Z-axis direction) of the third region 13 is, for example, greater than 0 nm and not more than 25 nm.

Figure 5:
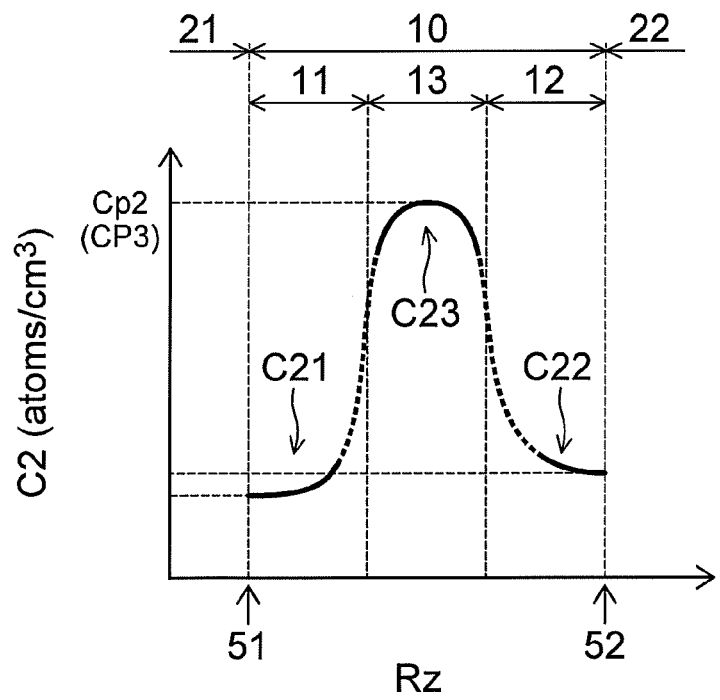
FIG. 5 is a schematic view illustrating the concentration of the second element in the first layer of the memory element according to the embodiment.

FIG. 5 is a schematic view illustrating the concentration of the second element in the first layer of the memory element according to the embodiment.

The vertical axis of FIG. 5 is a concentration C2 (atoms/cm$^3$) of the second element 32 in the first layer 10. The horizontal axis of FIG. 5 is the position Rz in the Z-axis direction.

In the example shown in FIG. 5, the first region 11 includes the second element 32. The concentration C2 of the second element 32 in the first layer 10 has a peak (a maximum value) that is not in the first region 11. A peak concentration Cp2 (the maximum value) of the second element 32 of the first layer 10 is higher than a concentration C21 of the second element 32 in the first region 11. Thereby, the retention characteristics of the data can be improved further. The first region 11 may not include the second element 32.

A concentration C23 of the second element 32 in the third region 13 is higher than the concentration C21 of the second element 32 in the first region 11.

For example, the concentration C23 of the second element 32 in the third region 13 is not less than $1 \times 10^{16}$ atoms/cm$^3$ and not more than $5 \times 10^{22}$ atoms/cm$^3$. In the case where the third region 13 is not an oxide film of the second element 32, the concentration C23 favorably is not less than $1 \times 10^{18}$ atoms/cm$^3$ and not more than $1 \times 10^{21}$ atoms/cm$^3$.

For example, the concentration C21 of the second element 32 in the first region 11 is less than $1 \times 10^{16}$ atoms/cm$^3$.

In the example shown in FIG. 5, the second region 12 includes the second element 32. The concentration C23 of the second element 32 in the third region 13 is higher than a concentration C22 of the second element 32 in the second region 12. The second region 12 may not include the second element 32.

For example, the concentration C22 of the second element 32 in the second region 12 is less than $1 \times 10^{16}$ atoms/cm$^3$.

For example, a peak concentration Cp3 (the maximum value) of the second element 32 in the third region 13 is not less than 10 times, and favorably not less than 50 times, the maximum value of the concentration C21 of the second element 32 in the first region 11.

The concentration shown in FIG. 5 is an example; and the concentration C2 of the second element 32 of the embodiment is not limited to that recited above.

Figure 6:
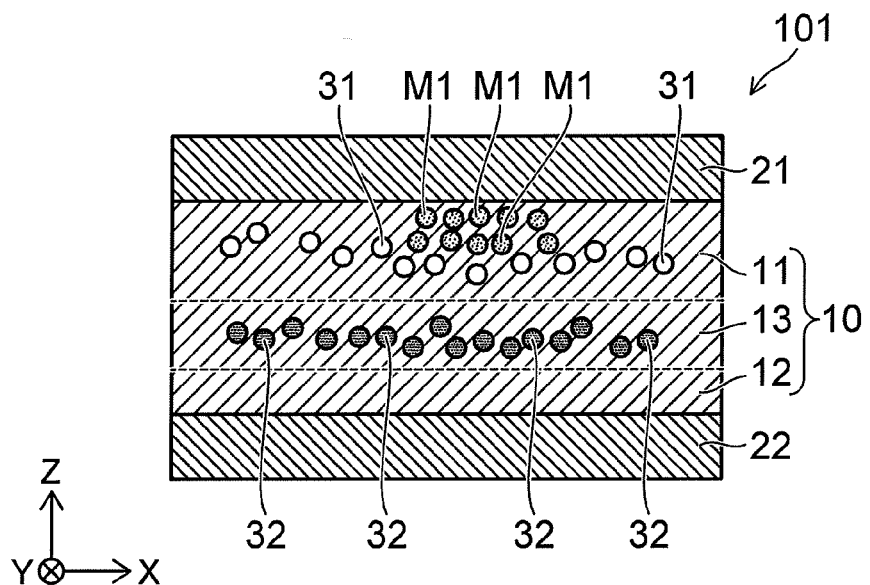
FIG. 6 is a schematic cross-sectional view illustrating operations of the memory element according to the embodiment.

FIG. 6 is a schematic cross-sectional view illustrating operations of the memory element according to the embodiment.

FIG. 6 illustrates the low resistance state of the memory element 101. In the embodiment, the first layer 10 (the third region 13) includes the second element 32 (the positively-charged element). Thereby, it is considered that the ionized first metallic element M1 concentrates more easily in the first region 11. Thereby, it is considered that a more stable low resistance state is obtained. According to the embodiment, the retention characteristics of the data can be improved.

In the low resistance state, the concentration (atoms/cm$^3$) of the first metallic element M1 in the first region 11 is higher than the concentration (atoms/cm$^3$) of the first metallic element M1 in the third region 13. Or, in the low resistance state, the third region 13 may not include the first metallic element M1.

Figure 7:
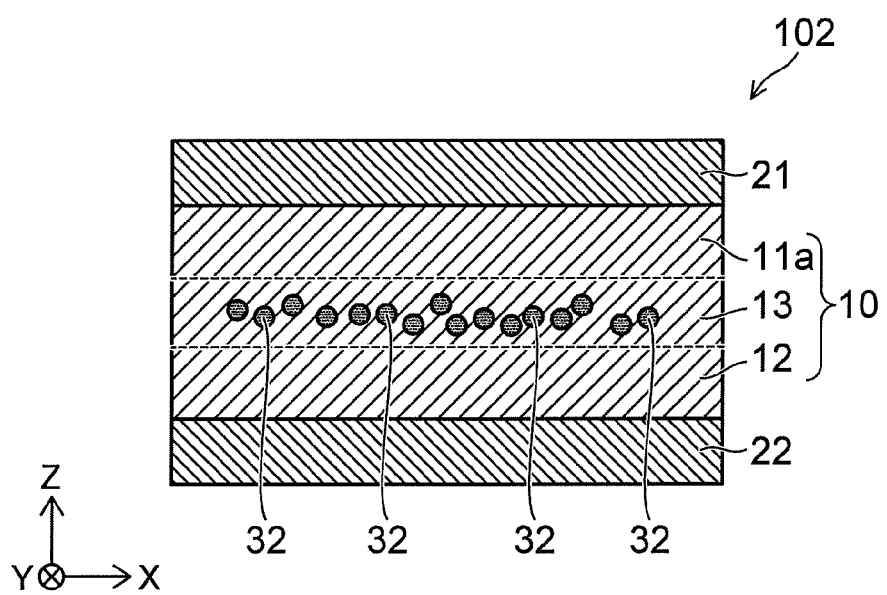
FIG. 7 is a schematic cross-sectional view illustrating another memory element according to the embodiment.

FIG. 7 is a schematic cross-sectional view illustrating another memory element according to the embodiment.

In the memory element 102 according to the embodiment as shown in FIG. 7, the first layer 10 includes a first region 11a, the second region 12, and the third region 13.

The first region 11a does not include the first element 31. Otherwise, a description similar to the first region 11 described above is applicable to the first region 11a.

In the memory element 102 as well, the first region 11a does not include the second element 32. Or, the first region 11a includes the second element 32; and the peak concentration of the second element 32 in the first layer 10 is higher than the concentration of the second element 32 in the first region 11a. Thereby, the retention characteristics of the data can be improved.

Figure 8A:
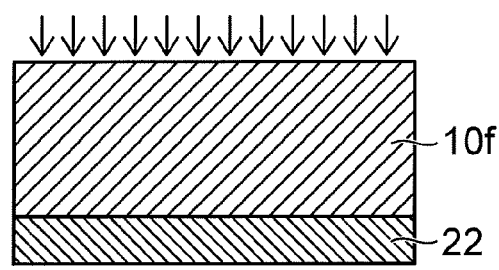
FIG. 8A to FIG. 8C are schematic cross-sectional views in order of the processes, illustrating a method for manufacturing the memory element according to the embodiment.
Figure 8B:
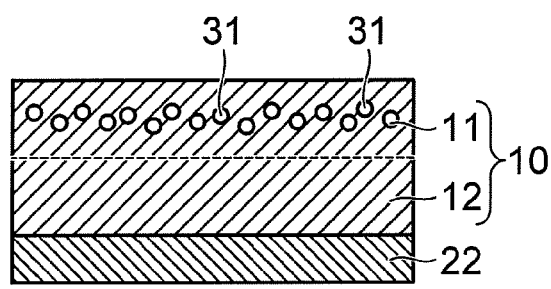
Figure 8C:
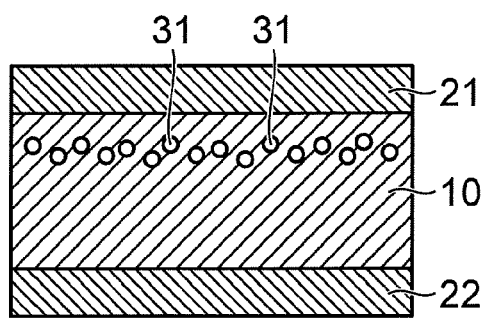

FIG. 8A to FIG. 8C are schematic cross-sectional views in order of the processes, illustrating a method for manufacturing the memory element according to the embodiment.

FIG. 8A to FIG. 8C illustrate the method for manufacturing the memory element 100 shown in FIG. 1.

The second conductive layer 22 is formed as shown in FIG. 8A. A first film 10f that is used to form the first layer 10 is formed on the second conductive layer 22. For example, a film (a layer) of silicon oxide (SiO$_2$) is formed as the first film 10f. At this time, the first element 31 (and the second element 32) is (are) substantially not included in the first film 10f.

Subsequently, the first element 31 is introduced to the region of the first film 10f on the front surface side by ion implantation. Or, the front surface of the first film 10f is exposed to a gas including the first element 31 or plasma of the first element 31. Thereby, the first element 31 is introduced to the region of the first film 10f on the front surface side.

Subsequently, heat treatment is performed as appropriate. Thus, as shown in FIG. 8B, the first layer 10 that includes the first region 11 and the second region 12 is formed.

Subsequently, as shown in FIG. 8C, the first conductive layer 21 is formed on the first layer 10. Thus, the memory element 100 can be formed.

Figure 9A:
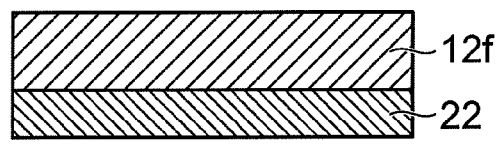
FIG. 9A to FIG. 9C are schematic cross-sectional views in order of the processes, illustrating the method for manufacturing the memory element according to the embodiment.
Figure 9B:
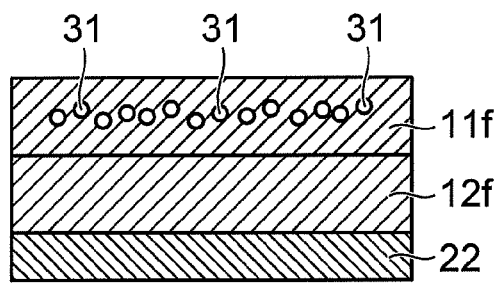
Figure 9C:
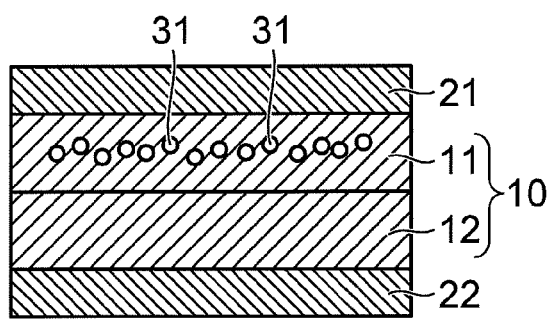

FIG. 9A to FIG. 9C are schematic cross-sectional views in order of the processes, illustrating the method for manufacturing the memory element according to the embodiment.

FIG. 9A to FIG. 9C illustrate another method for manufacturing the memory element 100 shown in FIG. 1.

The second conductive layer 22 is formed as shown in FIG. 9A. A film 12f that is used to form at least a portion of the second region 12 is formed on the second conductive layer 22. For example, a film of silicon oxide is formed as the film 12f. At this time, the first element 31 (and the second element 32) substantially is (are) not included in the film 12f.

Subsequently, a film 11f that is used to form at least a portion of the first region 11 is formed on the film 12f. At this time, the film 11f includes the first element 31. For example, a gas that includes the first element 31 is used when forming the film 11f. The film formation may include, for example, CVD (Chemical Vapor Deposition), etc.

Thus, as shown in FIG. 9C, the first layer 10 that includes the first region 11 and the second region 12 is formed. Subsequently, the first conductive layer 21 is formed on the first layer 10. Thereby, the memory element 100 can be formed.

FIG. 10A to FIG. 10D are schematic cross-sectional views in order of the processes, illustrating a method for manufacturing the memory element according to the embodiment.

FIG. 10A to FIG. 10D illustrate the method for manufacturing the memory element 102 shown in FIG. 7.

Figure 10A:
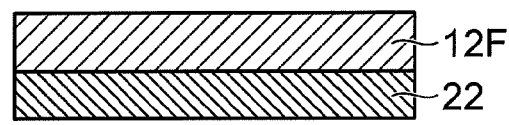
FIG. 10A to FIG. 10D are schematic cross-sectional views in order of the processes, illustrating a method for manufacturing the memory element according to the embodiment.

The second conductive layer 22 is formed as shown in FIG. 10A. A film 12F that is used to form at least a portion of the second region 12 is formed on the second conductive layer 22. For example, a film of silicon oxide is formed as the film 12F. At this time, the second element 32 (and the first element 31) substantially is (are) not included in the film 12F.

Figure 10B:
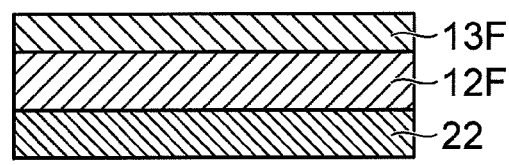

Subsequently, as shown in FIG. 10B, a film 13F that is used to form at least a portion of the third region 13 is formed on the film 12F. The film 13F is a film including the second element 32. For example, a film of aluminum oxide is formed as the film 13F.

Figure 10C:
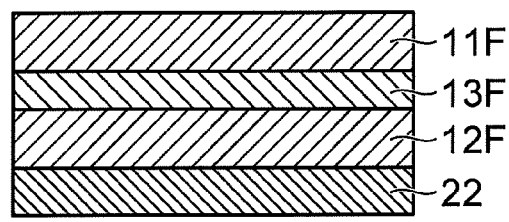
Figure 10D:
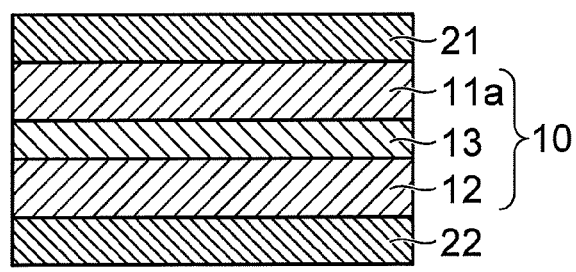

Subsequently, as shown in FIG. 10C, a film 11F that is used to form at least a portion of the first region 11a is formed on the film 13F. For example, a film of silicon oxide is formed as the film 11F. At this time, for example, the second element 32 (and the first element 31) substantially is (are) not included in the film 11F. Thus, the first layer 10 that includes the first region 11a, the second region 12, and the third region 13 can be formed.

Subsequently, the first conductive layer 21 is formed on the first layer 10. Thereby, the memory element 102 can be formed.

Similarly to the method for manufacturing the memory element 100, the first element 31 may be introduced to the film 11F in the formation of the film 11F. Thereby, the memory element 101 shown in FIG. 4 can be formed.

FIG. 11A to FIG. 11D are schematic perspective views illustrating memory devices according to the embodiment.

The memory devices according to the embodiment are, for example, cross-point nonvolatile memory devices. A stacked body that includes the first conductive layer 21, the first layer 10, and the second conductive layer 22 is used in the nonvolatile memory devices according to the embodiment.

Figure 11A:
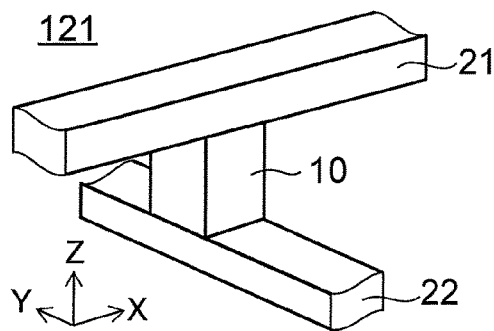
FIG. 11A to FIG. 11D are schematic perspective views illustrating memory devices according to the embodiment.

In a memory device 121 according to the embodiment as shown in FIG. 11A, the first conductive layer 21 extends in a second direction. The second direction is an X-axis direction. For example, the X-axis direction is orthogonal to the Z-axis direction (the stacking direction). The second conductive layer 22 extends in a third direction. The third direction is a Y-axis direction. For example, the Y-axis direction is orthogonal to the X-axis direction and the Z-axis direction.

The first layer 10 overlaps a portion of the first conductive layer 21 when projected onto a plane (the X-Y plane) perpendicular to the Z-axis direction. The first layer 10 overlaps a portion of the second conductive layer 22 when projected onto the X-Y plane. The first layer 10 overlaps the region where the first conductive layer 21 and the second conductive layer 22 overlap when projected onto the X-Y plane.

In the example, the first conductive layer 21 is used as one interconnect; and the second conductive layer 22 is used as another interconnect. The first layer 10 is provided at the position where these interconnects cross.

Figure 11B:
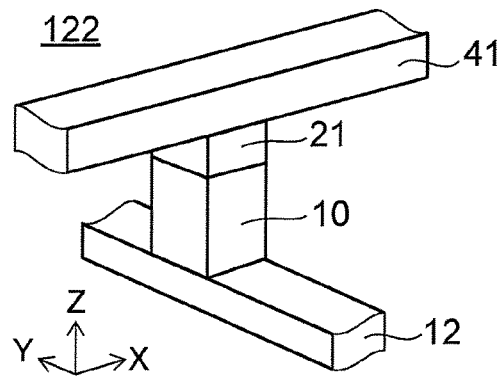

As shown in FIG. 11B, a first interconnect 41 is provided in a memory device 122. The first interconnect 41 extends in the X-axis direction. The second conductive layer 22 extends in the Y-axis direction. The first layer 10 overlaps a portion of the second conductive layer 22 when projected onto the X-Y plane. The first layer 10 and the first conductive layer 21 are provided between the first interconnect 41 and the second conductive layer 22. The first conductive layer 21, the first layer 10, and the second conductive layer 22 overlap a portion of the first interconnect 41 when projected onto the X-Y plane.

Figure 11C:
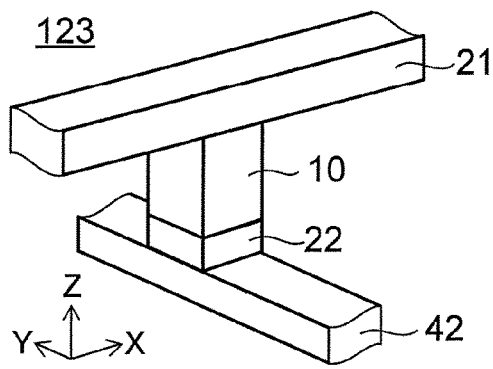

As shown in FIG. 11C, a second interconnect 42 is provided in a memory device 123. The second interconnect 42 extends in the Y-axis direction. The first conductive layer 21 extends in the X-axis direction. The first layer 10 overlaps a portion of the first conductive layer 21 when projected onto the X-Y plane. The first layer 10 and the second conductive layer 22 are provided between the second interconnect 42 and the first conductive layer 21. The first conductive layer 21, the first layer 10, and the second conductive layer 22 overlap a portion of the second interconnect 42 when projected onto the X-Y plane.

Figure 11D:
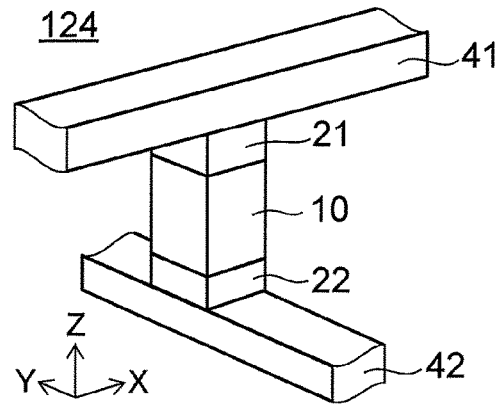

As shown in FIG. 11D, the first interconnect 41 and the second interconnect 42 are provided in a memory device 124. The first interconnect 41 extends in the X-axis direction. The second interconnect 42 extends in the Y-axis direction. The first conductive layer 21, the first layer 10, and the second conductive layer 22 are disposed between the first interconnect 41 and the second interconnect 42.

In the embodiment, at least one of the first conductive layer 21 or the second conductive layer 22 may be used as an interconnect. An interconnect (at least one of the first interconnect 41 or the second interconnect 42) may be provided separately from the first conductive layer 21 and the second conductive layer 22.

The stacked film that includes the first layer 10 may have a prism configuration or a circular columnar configuration (including a flattened circular configuration).

Figure 12:
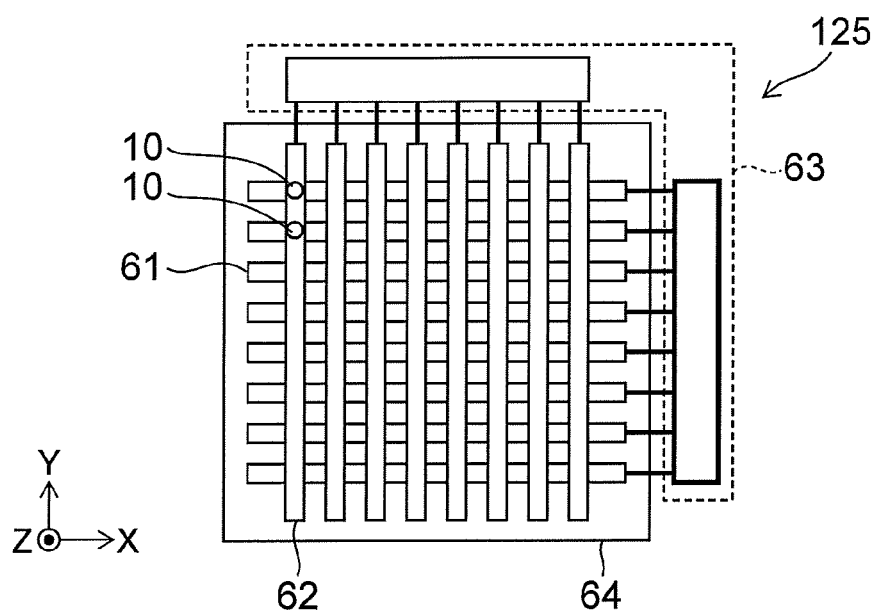
FIG. 12 is a schematic plan view illustrating a memory device according to the embodiment.

FIG. 12 is a schematic plan view illustrating a memory device according to the embodiment.

As shown in FIG. 12, multiple interconnects 61 and multiple interconnects 62 are provided in the memory device 125. The multiple interconnects 61 are parallel to each other. The multiple interconnects 62 are parallel to each other. The direction in which the interconnects 61 extend crosses the direction in which the interconnects 62 extend. For example, the interconnect 61 includes the first conductive layer 21 or the first interconnect 41. For example, the interconnect 62 includes the second conductive layer 22 or the second interconnect 42. For example, the interconnects 61 are used as word lines. For example, the interconnects 62 are used as bit lines.

Multiple stacked bodies (at least the first layers 10) are provided respectively at the crossing portions between the multiple interconnects 61 and the multiple interconnects 62. The interconnects 61 and the interconnects 62 are connected to a controller 63. One of the multiple first layers 10 is set to a selected state by the interconnects 61 and the interconnects 62; and the desired operation is performed. The memory device 125 is a cross-point resistance random access memory.

A substrate 64 is provided in the memory device 125. The interconnects 61 and the interconnects 62 are provided on the substrate 64. The stacking order of the stacked body including the first conductive layer 21, the first layer 10, and the second conductive layer 22 is arbitrary. For example, the second conductive layer 22 may be disposed between the substrate 64 and the first conductive layer 21. On the other hand, the first conductive layer 21 may be disposed between the substrate 64 and the second conductive layer 22. The Z-axis direction may cross the major surface of the substrate 64.

Multiple stacked bodies (the first conductive layer 21, the first layer 10, and the second conductive layer 22) may be stacked. In other words, the embodiment is applicable to a cross-point memory having a three-dimensionally stacked structure.

According to the embodiments, a memory element and a memory device can be provided in which the retention characteristics of the data can be improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components such as the first conductive layer, the second conductive layer, the first layer, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all memory elements and memory devices practicable by an appropriate design modification by one skilled in the art based on the memory elements and memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory element, comprising:
   a first conductive layer including an ion source;
   a second conductive layer; and
   a first layer including a first element and being provided between the first conductive layer and the second conductive layer, an electronegativity of the first element being greater than 2,
   the first layer including a first region and a second region, the first region including the first element, the second region being provided between the first region and the second conductive layer,
   the second region not including the first element, or
   the second region including the first element, and a concentration of the first element in the first region being higher than a concentration of the first element in the second region,
   wherein
   the first layer includes a second element,
   an electronegativity of the second element is 2 or less,
   the first region does not include the second element, or
   the first region includes the second element, and a peak concentration of the second element in the first layer is higher than a concentration of the second element in the first region.

2. The memory element according to claim 1, wherein the ion source of the first conductive layer comprises at least one selected from the group consisting of silver, copper, cobalt, nickel, aluminum, titanium, tantalum, and gold.

3. The memory element according to claim 1, wherein the first element comprises at least one selected from the group consisting of fluorine, chlorine, bromine, iodine, oxygen, sulfur, selenium, and tellurium.

4. The memory element according to claim 1, wherein the concentration of the first element in the first region is $1 \times 10^{16}$ atoms/cm$^3$ or more.

5. The memory element according to claim 1, wherein the first region contacts the first conductive layer, and the second region contacts the second conductive layer.

6. The memory element according to claim 1, wherein the second element comprises at least one selected from the group consisting of aluminum, lanthanum, hafnium, and yttrium.

7. The memory element according to claim 1, wherein the first layer includes a third region including the second element and being provided between the first region and the second region,
   the first region does not include the second element, or
   the first region includes the second element, and a concentration of the second element in the third region is higher than the concentration of the second element in the first region.

8. The memory element according to claim 7, wherein the second region does not include the second element, or the second region includes the second element, and the concentration of the second element in the third region is higher than a concentration of the second element in the second region.

9. The memory element according to claim 7, wherein the concentration of the second element in the third region is $1 \times 10^{16}$ atoms/cm$^3$ or more.

10. The memory element according to claim 7, wherein a peak concentration of the second element in the third region is not less than 10 times the concentration of the second element in the first region.

11. The memory element according to claim 1, wherein the concentration of the first element in the second region is less than $1 \times 10^{16}$ atoms/cm$^3$.

12. The memory element according to claim 1, wherein a peak concentration of the first element in the first region is not less than 10 times the concentration of the first element in the second region.

13. The memory element according to claim 12, wherein
a concentration of the first element at an interface between the first region and the first conductive layer is lower than the peak concentration of the first element in the first region, and
a concentration of the first element at an interface between the second region and the second conductive layer is less than $1 \times 10^{16}$ atoms/cm$^3$.

14. The memory element according to claim 1, wherein a thickness of the first region is not more than 0.5 times a thickness of the first layer.

15. The memory element according to claim 1, wherein the concentration of the second element in the first region is less than $1 \times 10^{16}$ atoms/cm$^3$.

16. A memory element, comprising:
a first conductive layer including an ion source;
a second conductive layer; and
a first layer including a second element and being provided between the first conductive layer and the second conductive layer, an electronegativity of the second element being 2 or less,
the first layer including a first region and a second region, the second region being provided between the first region and the second conductive layer,
the first region not including the second element, or
the first region including the second element, and a peak concentration of the second element in the first layer being higher than a concentration of the second element in the first region.

17. The memory element according to claim 16, wherein the ion source of the first conductive layer includes at least one selected from the group consisting of silver, copper, cobalt, nickel, aluminum, titanium, tantalum, and gold.

18. The memory element according to claim 16, wherein the second element includes at least one selected from the group consisting of aluminum, lanthanum, hafnium, and yttrium.

19. A memory element, comprising:
a first conductive layer including an ion source;
a second conductive layer; and
a first layer including a first element and at least one selected from the group consisting of silicon, germanium, silicon germanium, silicon oxide, germanium oxide, and silicon germanium oxide, the first layer being provided between the first conductive layer and the second conductive layer, an electronegativity of the first element being greater than 2, the first element comprising at least one selected from the group consisting of fluorine, chlorine, bromine, iodine, sulfur, selenium, and tellurium,
the first layer including a first region and a second region, the first region including the first element, the second region being provided between the first region and the second conductive layer,
the second region not including the first element, or
the second region including the first element, and a concentration of the first element in the first region being higher than a concentration of the first element in the second region.

* * * * *